(12) United States Patent
Sheu et al.

(10) Patent No.: US 7,956,282 B2
(45) Date of Patent: Jun. 7, 2011

(54) PHOTOELECTRIC CONVERSION ELEMENT

(75) Inventors: Jinn-Kong Sheu, Tainan (TW);
Liang-Jyi Yan, Taipei County (TW);
Chih-Sung Chang, Hsinchu (TW)

(73) Assignee: High Power Opto, Inc., Taichung County (TW)

( * ) Notice: Subject to any disclaimer, the term of this patent is extended or adjusted under 35 U.S.C. 154(b) by 179 days.

(21) Appl. No.: 12/210,358

(22) Filed: Sep. 15, 2008

(65) Prior Publication Data
US 2010/0065121 A1   Mar. 18, 2010

(51) Int. Cl.
*H01L 31/048*  (2006.01)
*H01L 31/0224* (2006.01)

(52) U.S. Cl. ........ 136/256; 136/252; 136/251; 136/259; 438/57; 362/183

(58) Field of Classification Search .................. 136/252, 136/255, 261, 262, 264, 265; 362/183; 257/13; 438/57
See application file for complete search history.

(56) References Cited

U.S. PATENT DOCUMENTS

| | | | | |
|---|---|---|---|---|
| 4,389,085 A | * | 6/1983 | Mori | 359/591 |
| 6,989,177 B2 | * | 1/2006 | Lin | 427/510 |
| 2004/0046166 A1 | * | 3/2004 | Cho et al. | 257/13 |
| 2006/0267034 A1 | * | 11/2006 | Orita | 257/95 |
| 2007/0085100 A1 | * | 4/2007 | Diana et al. | 257/98 |
| 2008/0290787 A1 | * | 11/2008 | Cok | 313/503 |
| 2009/0168410 A1 | * | 7/2009 | Tanamura et al. | 362/183 |

FOREIGN PATENT DOCUMENTS

WO    WO 2006/011525    *    2/2006

OTHER PUBLICATIONS

Hsu et al., High Efficiency 1 mm square AlGaInP LEDs Sandwihed by ITO Omni-Directional Refletor and Current Spreading Layer, Photonics Technology Letters, IEEE, vol. 19, No. 7, pp. 492-494, 2007.*

* cited by examiner

*Primary Examiner* — Jennifer K. Michener
*Assistant Examiner* — Jayne Mershon
(74) *Attorney, Agent, or Firm* — Muncy, Geissler, Olds & Lowe, PLLC

(57) ABSTRACT

A photoelectric conversion element comprises a solar-energy epitaxial layer, a bond layer and a LED epitaxial layer, which are stacked sequentially. The bond layer has a plurality of holes allowing light to pass. The solar-energy epitaxial layer receives light via the holes and generates electric energy, and an external secondary battery stores the electric energy. When environmental illumination disappears, the LED epitaxial layer is powered by the external secondary battery to emit light. When the photoelectric conversion element of the present invention applies to outdoor traffic signs, advertisement signboards and indicators, they can operate without external power supply.

6 Claims, 2 Drawing Sheets

US 7,956,282 B2

PHOTOELECTRIC CONVERSION ELEMENT

FIELD OF THE INVENTION

The present invention relates to a photoelectric conversion structure, particularly to a conversion structure converting light energy into electric energy and vice versa.

BACKGROUND OF THE INVENTION

Among green energy technologies, solar energy is a maturer one. Solar cells are usually used to directly convert light energy into electric energy. For example, the solar cells on an electronic calculator and the solar cells on the roof of a house directly convert light energy into electric energy, and the electric energy is stored for the following usage. From 1960s, satellites have adopted solar cells as the energy source. From 1970s energy crisis, solar energy began its civil application.

Solar cells may be based on three effects: (1) Photoelectric effect: Photons incident on the surface of a metal hit electrons of the metal, and the electrons absorbing sufficient photons energy then leave the metal to be free electrons in vacuum, and the free electrons become photocurrent under an external voltage; (2) Dember effect (Photodiffusion effect): Photons incident on a semiconductor excite electron-hole pairs, the electron-hole pairs are converted into photocurrent; (3) Photovoltaic effect: Photons incident on a p-n diode induce a potential difference at two sides of the p-n junction. At present, solar cells are usually based on the photovoltaic effect.

The current focus of solar energy researches is to increase the efficiency thereof. In illumination and display applications, solar cells and light emitting elements are separately installed. For example, the traffic signs, advertisement signboards or indicators need solar cells converting light into electric energy, secondary batteries storing electric energy, a light emitting component, a circuit board controlling the abovementioned components. However, the many components increase cost, waste space, increase environmental burden, which all conflict with the aims of green energy.

SUMMARY OF THE INVENTION

One objective of the present invention is to provide a photoelectric conversion element, wherein a single element can undertake both light-to-electric energy conversion and electric-to-light energy conversion, whereby the photoelectric conversion element of the present invention can reduce the cost, consume fewer resources and contribute more to environmental protection.

To achieve the abovementioned objective, the present invention proposes a photoelectric conversion element comprising a solar-energy epitaxial layer, a bond layer and a LED (Light Emitting Diode) epitaxial layer. The solar-energy epitaxial layer includes an N-type semiconductor layer and a P-type semiconductor layer stacked together top down or bottom up. The bond layer is stacked on the solar-energy epitaxial layer and has a plurality of holes allowing light to pass. The LED epitaxial layer is stacked on the bond layer and includes an electron supply layer, a hole supply layer and an active layer.

The solar-energy epitaxial layer receives light passing through the plurality of holes and generates electric energy. The LED epitaxial layer converts electric energy into light. Thereby, a single photoelectric conversion element of the present invention can function as a solar cell and a LED. Therefore, the present invention can decrease required elements, reduce cost, save space, lessen environmental burden and meet the aim of green energy.

DETAILED DESCRIPTION OF THE PREFERRED EMBODIMENTS

The technical contents of the present invention will be described in detail in cooperation with the embodiments. However, it should be understood that the embodiments are only to exemplify the present invention but not to limit the scope of the present.

Figure 1:
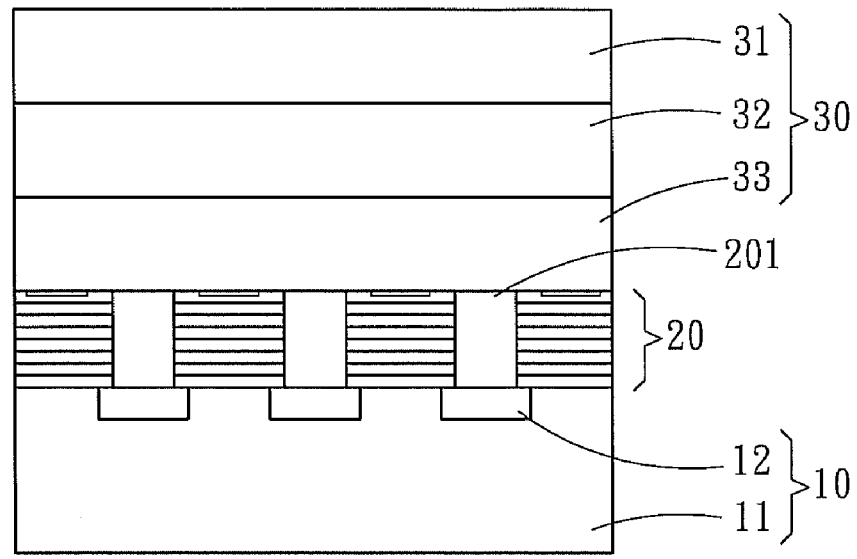
FIG. 1 is a diagram schematically showing the structure of a photoelectric conversion element according to the present invention.

Refer to FIG. 1. The photoelectric conversion element of the present invention comprises a solar-energy epitaxial layer 10, a bond layer 20 and a LED (Light Emitting Diode) epitaxial layer 30. The solar-energy epitaxial layer 10 includes an N-type semiconductor layer 11 and a P-type semiconductor layer 12 stacked together top down or bottom up. The bond layer 20 is stacked on the solar-energy epitaxial layer 10 and has a plurality of holes 201 allowing light to pass. The LED epitaxial layer 30 is stacked on the bond layer 20 and includes an electron supply layer 31, a hole supply layer 33 and an active layer 32.

The LED epitaxial layer 30 is fabricated with an MOVCD (Metal-Organic Chemical Vapor Deposition) method, an LPE (Liquid Phase Epitaxy) method, or an MBE (Molecular Beam Epitaxy) method. The active layer 32 is a MQW (Multiple Quantum Well)-structure light emitting area having a periodical structure containing AlInGaN (Aluminum Indium Gallium Nitride). The electron supply layer 31 is made of an N-type gallium nitride. The hole supply layer 33 is made of a P-type gallium nitride.

For fabricating the PN structure of the solar-energy epitaxial layer 10, an N-type semiconductor substrate is prepared firstly. Next, the surface of the N-type semiconductor substrate is doped to form a P-type semiconductor. Thus are formed the N-type semiconductor layer 11 and the P-type semiconductor layer 12. Alternatively, a P-type semiconductor substrate is prepared firstly, and the surface of the P-type semiconductor substrate is doped to form an N-type semiconductor. The material of the abovementioned semiconductor is a common semiconductor material, such as silicon, germanium, gallium arsenide, etc.

Figure 2:
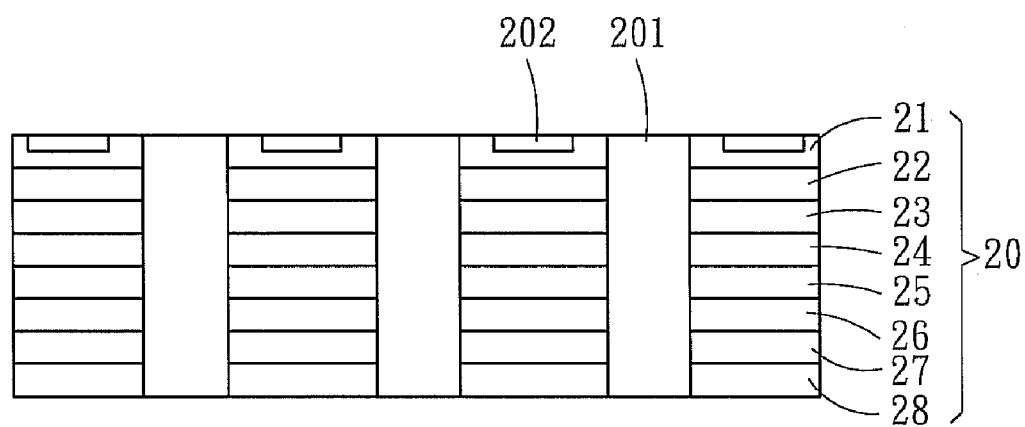
FIG. 2 is a diagram schematically showing the detailed structure of a bond layer according to the present invention.

Refer to FIG. 2. In the bond layer 20, an indium tin oxide layer 21, a silver layer 22, a titanium layer 23, a platinum layer 24, a gold layer 25, an indium layer 26, a gold layer 27 and a titanium layer 28 are stacked sequentially, wherein the indium tin oxide layer 21 contacts the LED epitaxial layer 30, and the titanium layer 28 contacts the solar-energy epitaxial layer 10. In practical fabrication, the silver layer 22, titanium layer 23, platinum layer 24, gold layer 25 and indium layer 26 are sequentially formed over the solar-energy epitaxial layer 10; the titanium layer 28 and gold layer 27 are formed over the LED epitaxial layer 30; then, the solar-energy epitaxial layer 10 and the LED epitaxial layer 30 are boned together via joining the indium layer 26 and the gold layer 27. The bond layer 20 can provide superior bonding and electric conduction. The plurality of holes 201 allowing light to pass are hollow holes or filled with a transparent material.

Figure 3:
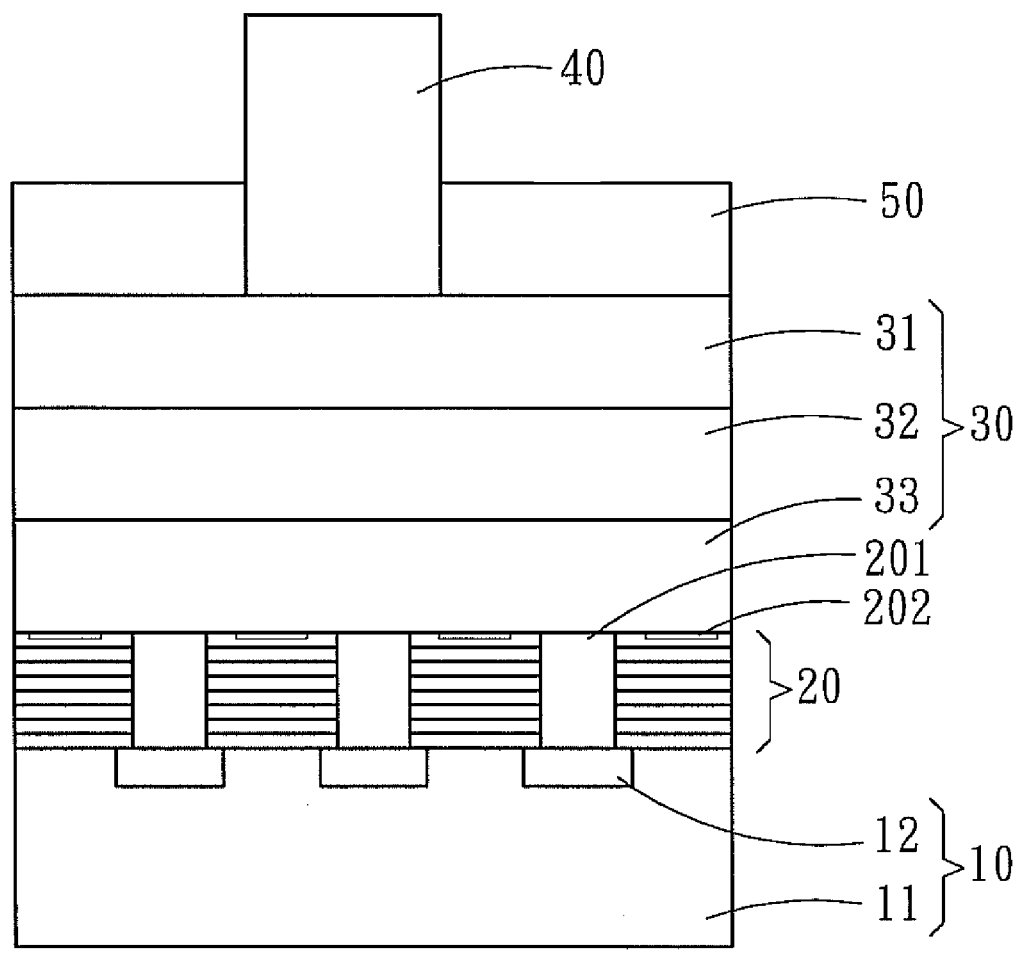
FIG. 3 is a diagram schematically showing an embodiment of the present invention.

Refer to FIG. 3. In the present invention, an ohmic contact layer 40 is formed over the LED epitaxial layer 30, and gold-beryllium alloy pads 202 are formed in between the indium tin oxide layer 21 and the LED epitaxial layer 30, whereby electric conduction is improved. Further, a protection layer 50 is formed over the LED epitaxial layer 30 and outside the ohmic contact layer 40 to protect the LED epitaxial layer 30. Besides, the portion of the LED epitaxial layer 30 contacting the protection layer 50 may have a roughened surface to reduce light reflection and increase light output efficiency.

In a preferred embodiment of the present invention, each layer may be fabricated with a MOVCD method; the protection layer 50 is a silicon dioxide layer; the LED epitaxial layer 30 is a multi-layer structure containing AlGaInP (n type, 2 μm)-AlInP (n type, 0.5 μm)-MQW (20-25 pairs)-AlInP (p type, 0.8 μm)-GaP (p type, 8~10 μm); the bond layer 20 is a multi-layer structure containing layers respectively made of indium tin oxide, silver, titanium, platinum, gold, indium, gold and titanium, and the bonding temperature of the bond layer 20 is 220° C.; the solar-energy epitaxial layer 10 has a P-type silicon semiconductor substrate, and the surface of the P-type silicon semiconductor substrate is doped to form an N-type semiconductor. The photoelectric conversion element of this embodiment generates power by the solar-energy epitaxial layer 10 and emits light by the LED epitaxial layer 30, and the power generation efficiency η thereof reaches as high as 4%.

In conclusion, the present invention can convert light into electricity and vice versa. Thus, the present invention can function as a LED and a solar cell. The present invention applies to the traffic signs, advertisement signboards and indicators, which are powered by solar energy. The present invention can replace the conventional solar cell and LED. Therefore, the present invention can decrease required elements, reduce cost, save space, lessen environmental burden and meet the aim of green energy.

What is claimed is:

1. A photoelectric conversion element comprising
    a solar-energy layer including an N-type semiconductor layer and a P-type semiconductor layer stacked together top down or bottom up, said P-type semiconductor layer being doped on a surface of said N-type semiconductor layer;
    a bond layer stacked on said solar-energy layer and having a plurality of holes allowing light to pass, including an indium tin oxide layer, a silver layer, a titanium layer, a platinum layer, a gold layer, an indium layer, a gold layer and a titanium layer stacked sequentially; and
    a LED (Light Emitting Diode) layer stacked on one side of said bond layer opposed to said solar-energy layer and including an electron supply layer, a hole supply layer and an active layer;
    wherein said indium tin oxide layer directly contacts said LED layer, and said titanium layer directly contacts said solar-energy layer, said holes completely extending through said layers of said bond layer between said solar-energy layer and said LED layer, and said P-type semiconductor layer being located directly under said holes to receive the light passing through said holes.

2. The photoelectric conversion element according to claim 1, wherein said active layer has a MQW (Multiple Quantum Well) structure having a periodical structure containing AlInGaN (Aluminum Indium Gallium Nitride); said electron supply layer is made of an N-type gallium nitride, and said hole supply layer is made of a P-type gallium nitride.

3. The photoelectric conversion element according to claim 1, wherein said plurality of holes are filled with a transparent material.

4. The photoelectric conversion element according to claim 1, wherein an ohmic contact layer is formed over said LED layer, and a gold-beryllium alloy pad is formed in between said indium tin oxide layer and said LED layer.

5. The photoelectric conversion element according to claim 4, wherein a protection layer is formed outside said LED layer and outside said ohmic contact layer.

6. The photoelectric conversion element according to claim 5, wherein a portion of said LED layer contacting said protection layer has a roughened surface.

* * * * *